United States Patent
Kushima et al.

(10) Patent No.: US 11,901,329 B2
(45) Date of Patent: Feb. 13, 2024

(54) WIRE BONDING METHOD AND WIRE BONDING APPARATUS

(71) Applicant: KAIJO CORPORATION, Tokyo (JP)

(72) Inventors: Mami Kushima, Tokyo (JP); Tamanari Yasuda, Tokyo (JP)

(73) Assignee: KAIJO CORPORATION, Tokyo (JP)

(*) Notice: Subject to any disclaimer, the term of this patent is extended or adjusted under 35 U.S.C. 154(b) by 442 days.

(21) Appl. No.: 17/277,911

(22) PCT Filed: Jun. 17, 2019

(86) PCT No.: PCT/JP2019/023787
§ 371 (c)(1),
(2) Date: Mar. 19, 2021

(87) PCT Pub. No.: WO2020/255180
PCT Pub. Date: Dec. 24, 2020

(65) Prior Publication Data
US 2021/0351155 A1    Nov. 11, 2021

(51) Int. Cl.
*B23K 20/00* (2006.01)
*H01L 23/00* (2006.01)

(52) U.S. Cl.
CPC ............ H01L 24/78 (2013.01); B23K 20/004 (2013.01); B23K 20/005 (2013.01); H01L 24/48 (2013.01);
(Continued)

(58) Field of Classification Search
CPC ....... H01L 2224/78301; H01L 2924/00; H01L 24/78; B23K 2101/40; B23K 20/004; B23K 20/007; B23K 20/10
See application file for complete search history.

(56) References Cited

U.S. PATENT DOCUMENTS 4,860,433 A * 8/1989 Miura .................... H05K 3/328
                                                336/200
6,110,823 A * 8/2000 Eldridge ................. H01L 24/12
                                                257/E21.507
(Continued)

FOREIGN PATENT DOCUMENTS

JP          4-196549          7/1992
JP          6-29342           2/1994
(Continued)

OTHER PUBLICATIONS

International Search Report dated Aug. 27, 2019 in International (PCT) Application No. PCT/JP2019/023787.

*Primary Examiner* — Erin B Saad
(74) *Attorney, Agent, or Firm* — Wenderoth, Lind & Ponack, L.L.P.

(57) ABSTRACT

A wire bonding method for connecting a wire to two different surfaces by bonding with a single wire bonding step. The wire bonding method includes: bonding one end of a wire fed from a distal end of a capillary to a first bonding surface; moving the capillary in the Z direction; moving the capillary the X and/or Y direction; moving the capillary in the X, Y, and/or Z direction, a plurality of times; moving the capillary to a highest position; and bonding another end of the wire to the second bonding surface. The wire bonding method includes, at any timing, rotating the first bonding surface about a rotation axis to move the second bonding surface to a position capable of bonding. An angle formed by the first bonding surface and the second bonding surface on a side where the wire is stretched is 200° or more.

4 Claims, 7 Drawing Sheets

(52) U.S. Cl.
CPC .... *H01L 24/85* (2013.01); *H01L 2224/48091* (2013.01); *H01L 2224/48095* (2013.01); *H01L 2224/78802* (2013.01); *H01L 2224/78822* (2013.01)

(56) References Cited

U.S. PATENT DOCUMENTS

| | | | | |
|---|---|---|---|---|
| 6,727,579 | B1* | 4/2004 | Eldridge | H01L 24/72 257/E23.024 |
| 2001/0020546 | A1* | 9/2001 | Eldridge | G01R 1/07378 257/E21.507 |
| 2005/0173791 | A1* | 8/2005 | Hsu | H01L 24/85 257/E23.033 |
| 2007/0228110 | A1* | 10/2007 | Eldridge | H01L 21/67288 228/180.5 |
| 2010/0065963 | A1* | 3/2010 | Eldridge | H01L 24/78 257/734 |
| 2010/0148369 | A1* | 6/2010 | Mii | H01L 24/85 29/829 |
| 2011/0155789 | A1* | 6/2011 | Aoyagi | B23K 20/007 228/1.1 |
| 2011/0315743 | A1* | 12/2011 | Maruya | H01L 24/78 228/49.5 |

FOREIGN PATENT DOCUMENTS

| | | |
|---|---|---|
| JP | 6-53267 | 2/1994 |
| JP | 7-186442 | 7/1995 |
| JP | 6316340 | 4/2018 |

* cited by examiner

WIRE BONDING METHOD AND WIRE BONDING APPARATUS

TECHNICAL FIELD

The present invention relates to a wire bonding method and a wire bonding apparatus.

BACKGROUND ART

Figure 9:
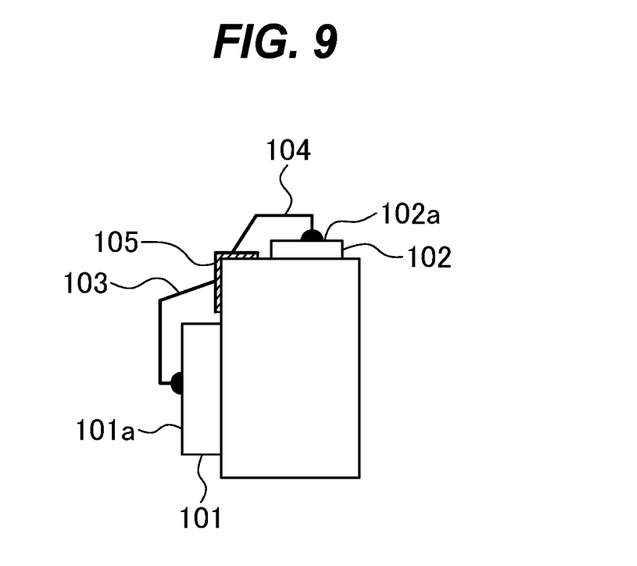
FIG. 9 is a cross-sectional view illustrating a conventional semiconductor product.

FIG. 9 is a cross-sectional view illustrating a conventional semiconductor device.

This semiconductor product includes a first electrode 101 having a first bonding surface 101a and a second electrode 102 having a second bonding surface 102a, and the first bonding surface 101a and the second bonding surface 102a are electrically connected to each other by bonding wires 103 and 104 and wiring 105.

Figure 10:
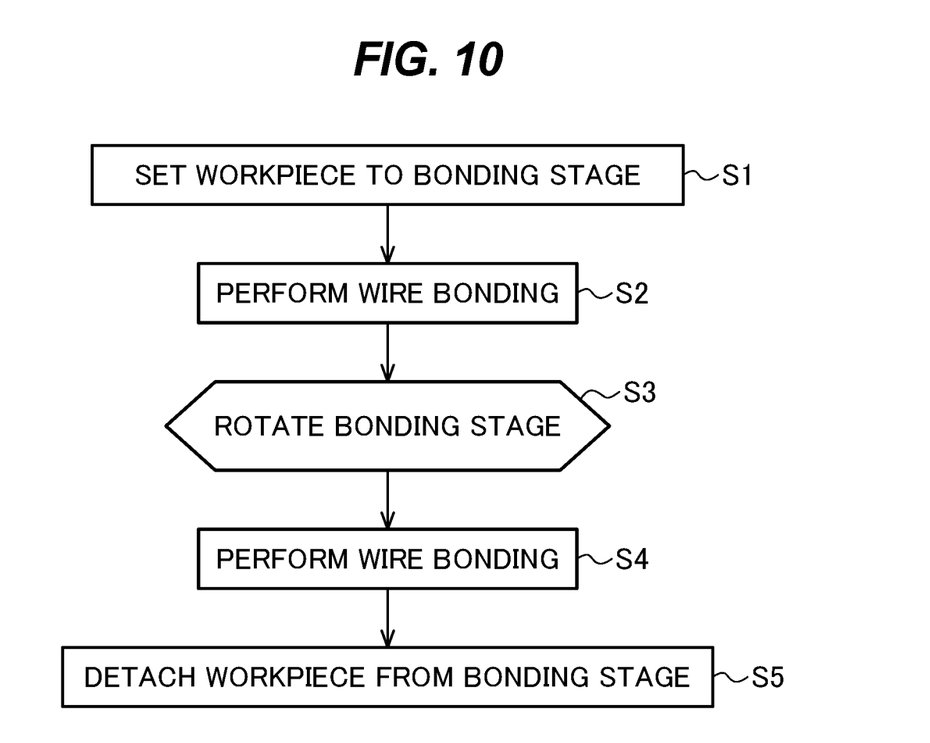
FIG. 10 is a flowchart for describing a conventional wire bonding method for manufacturing the semiconductor product illustrated in FIG. 9.

FIG. 10 is a flowchart for describing a conventional wire bonding method for manufacturing the semiconductor product illustrated in FIG. 9.

First, a workpiece is set to a bonding stage of a wire bonding apparatus (not shown) (S1 in FIG. 10).

Next, the bonding wire 103 is connected to the first bonding surface 101a of the first electrode 101 and the wiring 105 such that the first electrode 101 and the wiring 105 are electrically connected to each other by the bonding wire 103 (S2 in FIG. 10).

Next, the bonding stage is rotated by 90° by a rotation mechanism such that the wire bonding apparatus becomes ready to bond the second bonding surface 102a (S3 in FIG. 10).

Next, the bonding wire 104 is connected to the second bonding surface 102a of the second electrode 102 and the wiring 105 such that the second electrode 102 and the wiring 105 are electrically connected to each other by the bonding wire 104 (S4 in FIG. 10).

Next, the workpiece is detached from the bonding stage. In this manner, the semiconductor product illustrated in FIG. 9 can be manufactured. The related technology is disclosed in Patent Literature 1.

By the way, when two different surfaces such as the first bonding surface 101a and the second bonding surface 102a need to be electrically connected, a method for bonding the first bonding surface 101a and the second bonding surface 102a directly by a single bonding wire is not used. Like the above-mentioned conventional wire bonding method, measures have been taken to perform bonding in the respective surfaces and add a wiring circuit for connecting the two different surfaces.

CITATION LIST

Patent Literature

Patent Literature 1: Japanese Patent No. 6316340

SUMMARY OF INVENTION

Technical Problem

In the conventional wire bonding method, two bonding wires need to be stretched, and hence the wire bonding step needs to be performed twice, and production tact time decreases. The addition of the wiring circuit increases production cost.

It is an object of one aspect of the present invention to provide a wire bonding method or a wire bonding apparatus capable of connecting a wire to two different surfaces by bonding with a single wire bonding step.

Solution to Problem

Various aspects of the present invention are described below.

[1] A wire bonding method for bonding one end of a wire to a first bonding surface and bonding another end of the wire to a second bonding surface, including:
- a step (a) for bonding one end of a wire fed from a distal end of a capillary to the first bonding surface;
- a step (b) for moving the capillary in a Z direction while feeding the wire from the distal end of the capillary;
- a step (c) for moving the capillary in a direction including at least one of an X direction and a Y direction while feeding the wire from the distal end of the capillary;
- a step (d) for moving the capillary in a direction including at least one of the X direction, the Y direction, and the Z direction a plurality of times while feeding the wire from the distal end of the capillary;
- a step (e) for moving the capillary to a highest position; and
- a step (f) for moving the capillary to the second bonding surface and bonding the another end of the wire to the second bonding surface, in which
- the wire bonding method includes, at any timing between the step (b) and the step (e), a step for rotating the first bonding surface about a rotation axis to move the second bonding surface at a position capable of bonding, and
- an angle formed by the first bonding surface and the second bonding surface on a side where the wire is stretched is 200° or more (preferably 220° or more, more preferably 240° or more, still more preferably 255° or more).

[2] The wire bonding method according to item [1], in which the angle is 240° or more.

[3] The wire bonding method according to item [1] or [2], wherein the any timing is any one of a timing immediately after the step (b), a timing in a middle of the step (c), a timing immediately after the step (c), a timing in a middle of the step (d), and a timing immediately before the step (e).

[4] A wire bonding apparatus for bonding one end of a wire to a first bonding surface and bonding another end of the wire to a second bonding surface, comprising:
- a capillary having a through hole through which the wire is inserted;
- an X movement mechanism for moving the capillary relative in an X direction to the first bonding surface or the second bonding surface;
- a Y movement mechanism for moving the capillary relative in a Y direction to the first bonding surface or the second bonding surface;
- a Z movement mechanism for moving the capillary relative in a Z direction to the first bonding surface or the second bonding surface;
- a stage for holding a workpiece having the first bonding surface and the second bonding surface;
- a rotation mechanism for rotating the stage; and
- a control unit for controlling the capillary, the X movement mechanism, the Y movement mechanism, the Z movement mechanism, and the rotation mechanism, wherein the control unit controls the following operations (a) to (g):

an operation (a) for bonding the one end of the wire fed from a distal end of the capillary to the first bonding surface;

an operation (b) for moving the capillary in the Z direction while feeding the wire from the distal end of the capillary;

an operation (c) for moving the capillary in a direction including at least one of the X direction and the Y direction while feeding the wire from the distal end of the capillary;

an operation (d) for moving the capillary in a direction including at least one of the X direction, the Y direction, and the Z direction a plurality of times while feeding the wire from the distal end of the capillary;

an operation (e) for moving the capillary to a highest position;

an operation (f) for moving the capillary to the second bonding surface to bond the another end of the wire to the second bonding surface; and an operation (g) for rotating the stage by the rotation mechanism at any timing between the operation (b) and the operation (e) to move the second bonding surface to a position capable of bonding, and an angle formed by the first bonding surface and the second bonding surface on a side where the wire is stretched is 200° or more.

Advantageous Effects of Invention

One aspect of the present invention can provide the wire bonding method or the wire bonding apparatus capable of connecting a wire to two different surfaces by bonding with a single wire bonding step.

DESCRIPTION OF EMBODIMENTS

Embodiments of the present invention are described in detail below with reference to the drawings. However, the present invention is not limited to the following description, and it should be easily understood by a person skilled in the art that modes and details of the present invention can be variously modified without departing from the gist and scope of the present invention. Thus, the present invention is not intended to be interpreted as being limited to the description of the embodiments below.

Figure 1:
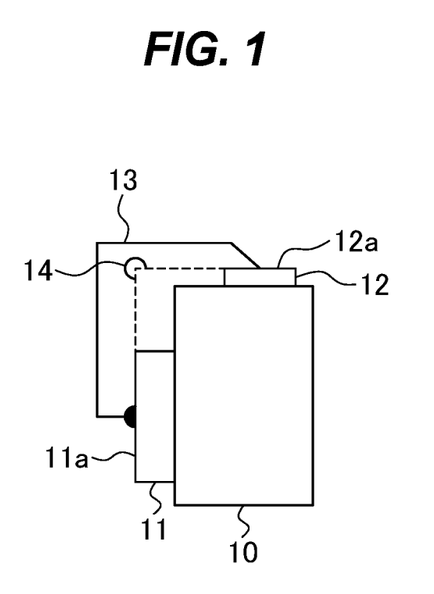
FIG. 1 is a cross-sectional view illustrating a semiconductor product of which surfaces are connected by a wire bonding method according to one aspect of the present invention.

FIG. 1 is a cross-sectional view illustrating a semiconductor product of which surfaces are connected by a wire bonding method according to one aspect of the present invention.

The semiconductor product illustrated in FIG. 1 includes a first electrode 11 having a first bonding surface 11a and a second electrode 12 having a second bonding surface 12a, and the first bonding surface 11a and the second bonding surface 12a are electrically connected to each other by a bonding wire 13. The first electrode 11 and the second electrode 12 are each formed on a product (workpiece) 10.

The first bonding surface 11a and the second bonding surface 12a are located on different planes. An angle 14 formed by the first bonding surface 11a and the second bonding surface 12a on the side where the bonding wire 13 is stretched is 270° (see FIG. 1).

Note that, in the present embodiment, the angle 14 formed by the first bonding surface 11a and the second bonding surface 12a is 270°, but the angle only needs to be 200° or more, preferably 220° or more, more preferably 240° or more, still more preferably 255° or more.

Figure 2A:
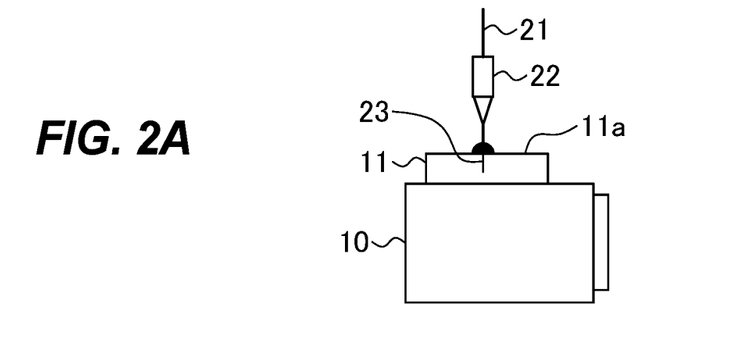
FIG. 2 are cross-sectional views for describing the wire bonding method according to one aspect of the present invention.
Figure 2B:
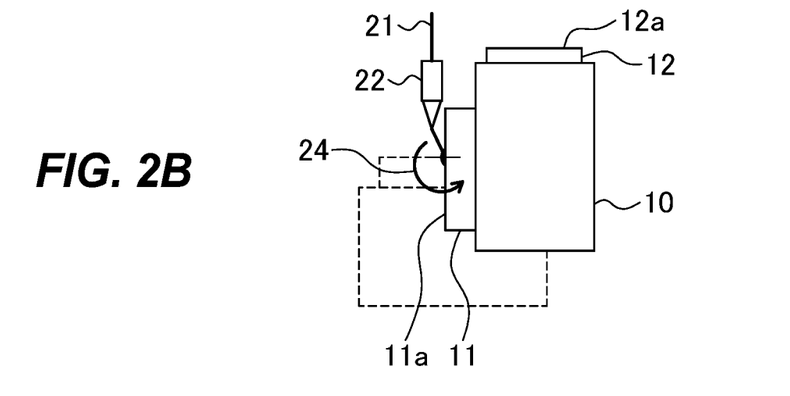
Figure 2C:
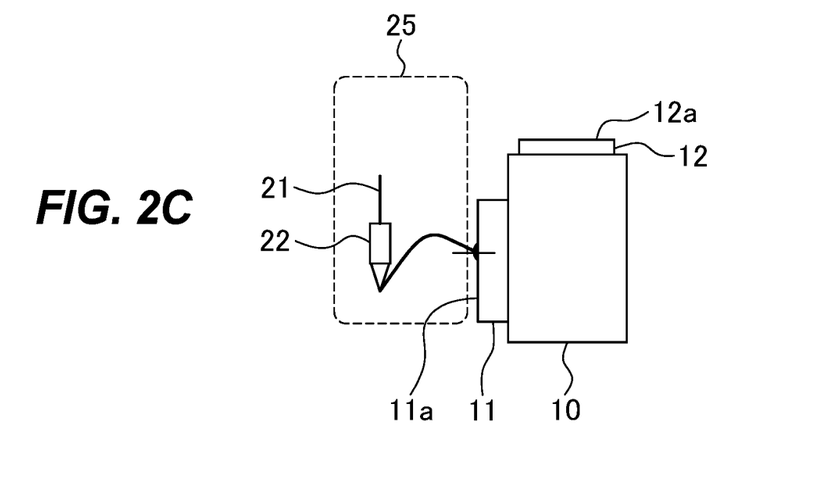
Figure 3:
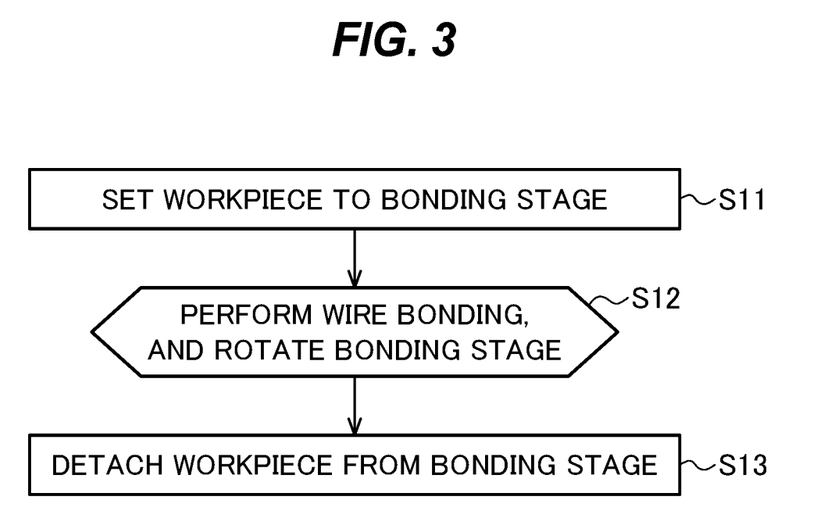
FIG. 3 is a flowchart for describing the wire bonding method illustrated in FIG. 2.

FIG. 2 are cross-sectional views for describing a wire bonding method according to one aspect of the present invention. FIG. 3 is a flowchart for describing the wire bonding method illustrated in FIG. 2.

First, the workpiece 10 is set to a bonding stage (not shown) (S11 in FIG. 3).

Next, as illustrated in FIG. 2 (a), a capillary 22 through which a wire 21 is inserted is held by an ultrasonic horn (not shown), and the wire 21 is fed from the capillary 22. A high voltage is applied between a distal end of the wire 21 protruding from a distal end of the capillary 22 and a discharge electrode (not shown) to cause spark discharge. A distal end portion of the wire 21 is melted by discharge energy thereof to create a ball. The ball is pushed onto the first bonding surface 11a of the first electrode 11, and ultrasonic waves are applied. In this manner, one end of the wire 21 is bonded to the first bonding surface 11a of the first electrode 11 by a bump.

Next, the capillary 22 is moved (raised) in a Z direction while feeding the wire 21 from the capillary 22. After that, the capillary 22 is moved in a direction including at least one of an X direction and a Y direction while feeding the wire 21, and the bonding stage is rotated by 90° about a rotation center 23 as indicated by an arrow 24 (see FIG. 2 (b)). In this manner, the second bonding surface 12a of the second electrode 12 can be moved to a position capable of wire bonding.

The bonding stage is rotated by 90° at the above-mentioned timing, and hence in the middle of loop control of the wire 21, the bonding stage can be rotated before the capillary 22 contacts the product 10, and a free space 25 without any obstacle can be formed (see FIG. 2 (c)). Next, the capillary 22 is moved in the free space 25 in a direction including at least one of the X direction, the Y direction, and the Z direction once or a plurality of times while feeding the wire from the distal end of the capillary.

Next, the capillary 22 is moved to the highest position (not shown).

Note that, in the above description, the capillary 22 is moved (raised) in the Z direction, and then the capillary 22 is moved in a direction including at least one of the X direction and the Y direction, and the bonding stage is rotated by 90°. However, the timing to rotate the bonding stage only needs to be after the capillary 22 is moved (raised) in the Z direction, and may be a timing before the capillary 22 is moved in a direction including at least one of the X direction and the Y direction, the same timing to move the capillary 22 in a direction including at least one of the X direction and the Y direction, a timing while the capillary 22 is moved in a direction including at least one of the X direction, the Y direction, and the Z direction a plurality of times, or a timing immediately after the capillary 22 is moved in a direction including at least one of the X direction, the Y direction, and the Z direction a plurality of times.

Next, the capillary 22 is moved to the second bonding surface 12a of the second electrode 12, and the other end of the wire 21 is bonded to the second bonding surface 12a (not shown). In this manner, the semiconductor product illustrated in FIG. 1 in which one end of the bonding wire 13 is bonded to the first bonding surface 11a and the other end of the bonding wire 13 is bonded to the second bonding surface 12a can be manufactured (S12 in FIG. 3). Next, the workpiece 10 is detached from the bonding stage (S13 in FIG. 3).

Note that the rotation axis around which the bonding stage is rotated by 90° in the step illustrated in FIG. 2(b) may be parallel to the first bonding surface 11a or may be on the first bonding surface 11a. The rotation direction of the bonding stage is not particularly limited as long as the first bonding surface and the second bonding surface can be connected in the single bonding step. The rotation axis is not necessarily required to be parallel to the first bonding surface 11a.

The above-mentioned wire bonding method can achieve the bonding wire 13 having a less bulging loop shape. The reasons are as follows.

After one end of the bonding wire 13 is bonded to the first bonding surface 11a, the motion of the capillary is limited in order to move (raise) the capillary in the Z direction while feeding the wire from the capillary and prevent the capillary from contacting the workpiece of the semiconductor product in FIG. 2. Further, if the rotational operation is performed after the capillary has been raised in the X direction, the Y direction, and the Z direction, the wire is excessively fed from the capillary. As a result, the loop shape of the resultant bonding wire is apt to be more bulging.

In the above-mentioned wire bonding method, on the other hand, one end of the wire 21 is bonded to the first bonding surface 11a of the first electrode 11, and then the bonding stage is rotated by 90° after the capillary 22 is moved (raised) in the Z direction, while the capillary 22 is moved in a direction including at least one of the X direction and the Y direction, while the capillary 22 is moved in a direction including at least one of the X direction, the Y direction, and the Z direction a plurality of times, or before the capillary 22 is moved to the highest position. In this manner, the capillary 22 can be prevented from contacting a workpiece without excessively feeding the wire 21 from the capillary 22. As a result, the bonding wire 13 having a less bulging loop shape can be achieved.

When the loop shape of the bonding wire is bulging, the following problems occur.

The use amount of the wire increases to increase product cost. The size reduction performance, the stability, and electric properties of the product deteriorate, and the quality of the product decreases and the value of the product decreases.

In the above-mentioned wire bonding method, as compared with the wire bonding method illustrated in FIG. 9 and FIG. 10, the number of times of the bonding step can be reduced from two to one, and the wiring 105 for connecting different surfaces becomes unnecessary, and hence the product cost can be decreased.

Next, a wire bonding apparatus and the wire bonding method according to one aspect of the present invention are described in more detail.

Figure 4:
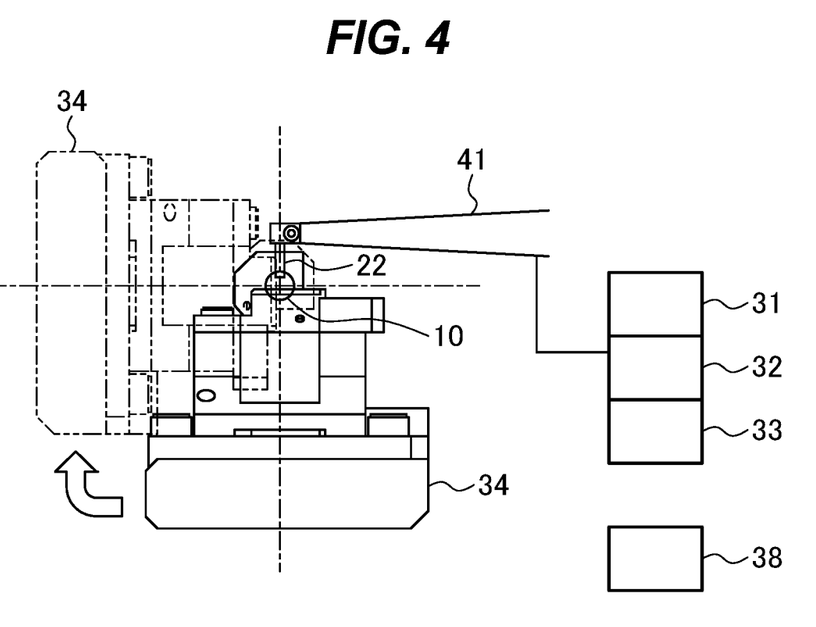
FIG. 4 is a schematic view illustrating a part of a wire bonding apparatus for implementing the wire bonding method according to one aspect of the present invention.
Figure 5:
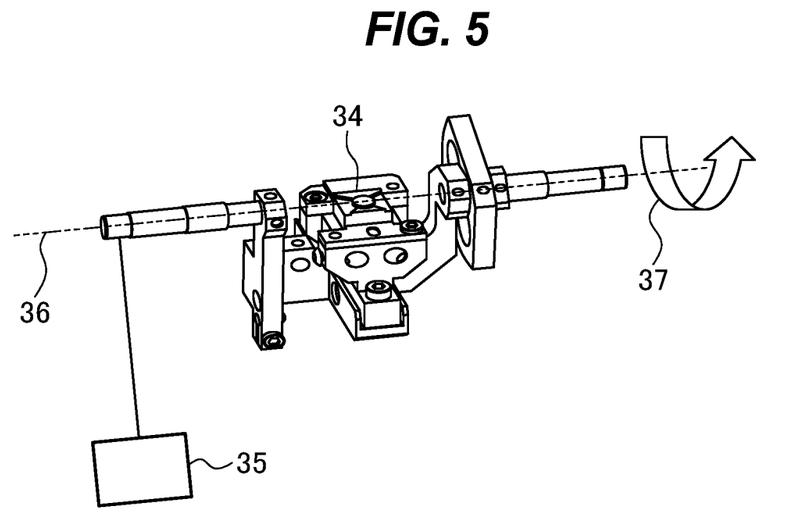
FIG. 5 is a perspective view illustrating a bonding stage and a rotation axis of the wire bonding apparatus illustrated in FIG. 4.

FIG. 4 is a schematic view illustrating a part of the wire bonding apparatus for implementing the wire bonding method according to one aspect of the present invention. FIG. 5 is a perspective view illustrating a bonding stage and a rotation axis of the wire bonding apparatus illustrated in FIG. 4.

As illustrated in FIG. 4 and FIG. 5, the wire bonding apparatus includes a capillary 22 having a through hole through which a wire is inserted, an X movement mechanism 31 for moving the capillary 22 in an X direction relative to a first bonding surface or a second bonding surface, a Y movement mechanism 32 for moving the capillary 22 in a Y direction relative to the first bonding surface or the second bonding surface, a Z movement mechanism 33 for moving the capillary 22 in a Z direction relative to the first bonding surface or the second bonding surface, a bonding stage 34 for holding a workpiece having the first bonding surface and the second bonding surface, a rotation mechanism 35 for rotating the bonding stage 34, and a control unit 38 for controlling the capillary 22, the X movement mechanism 31, the Y movement mechanism 32, the Z movement mechanism 33, and the rotation mechanism 35.

Figure 6:
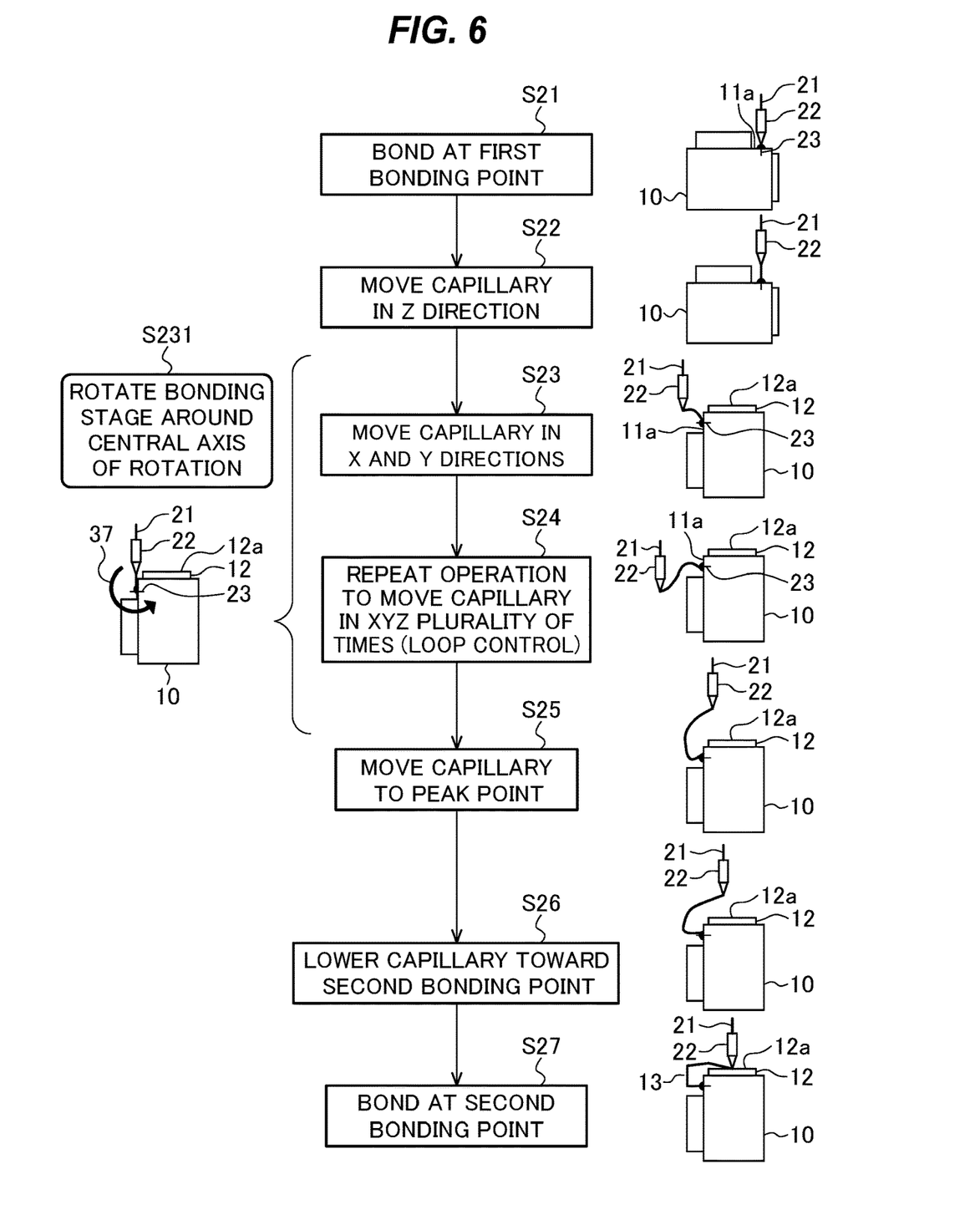
FIG. 6 is a schematic view for describing the wire bonding method according to one aspect of the present invention.
Figure 7:
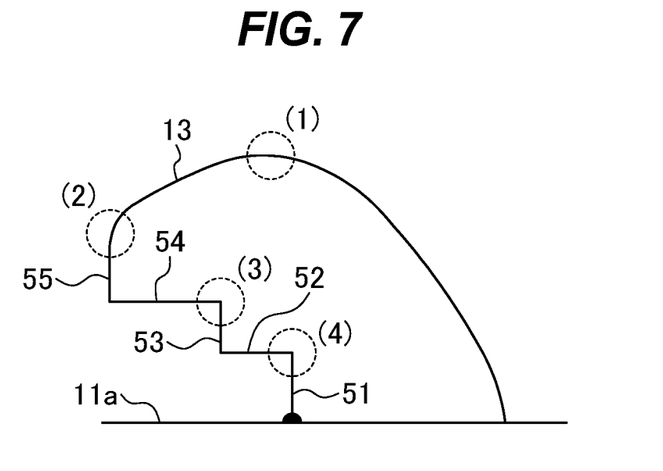
FIG. 7 is a schematic view illustrating an example of loop control performed by the wire bonding method illustrated in FIG. 6.

FIG. 6 is a schematic view for describing the wire bonding method according to one aspect of the present invention. FIG. 7 is a schematic view illustrating an example of loop control performed by the wire bonding method illustrated in FIG. 6.

First, a workpiece 10 is placed on the bonding stage 34 illustrated in FIG. 4 and FIG. 5.

Next, the capillary 22 through which a wire 21 is inserted is held by an ultrasonic horn 41, and the wire 21 is fed from the capillary 22. A high voltage is applied between a distal end of the wire 21 protruding from a distal end of the capillary 22 and a discharge electrode to cause spark discharge. A distal end portion of the wire 21 is melted by discharge energy thereof to create a ball. The ball is pushed onto the first bonding surface 11a, and ultrasonic waves are applied. In this manner, as illustrated in FIG. 6, one end of the wire 21 is bonded to a first bonding point of the first bonding surface 11a (S21 in FIG. 6).

Next, the capillary 22 is moved in the Z direction while feeding the wire 21 from the capillary 22 (S22 in FIG. 6). In this case, the capillary 22 moves as indicated by a movement locus 51 illustrated in FIG. 7.

After that, the capillary 22 is moved in a direction including at least one of the X direction and the Y direction while feeding the wire 21 (S23 in FIG. 6). In this case, the capillary 22 moves as indicated by a movement locus 52 illustrated in FIG. 7.

Next, the capillary 22 is moved in a direction including at least one of the X direction, the Y direction, and the Z direction a plurality of times while feeding the wire 21 (S24 in FIG. 6). The capillary 22 is moved to the highest position (apex) (S25 in FIG. 6). In this case, the capillary 22 moves as indicated by movement loci 53, 54, and 55 illustrated in FIG. 7.

At any timing between Step S22 and Step S25 illustrated in FIG. 6 (for example, (2), (3), or (4) illustrated in FIG. 7), the bonding stage 34 is rotated by the rotation mechanism 35 illustrated in FIG. 5 by 90° around an axis of a rotation center 36 as indicated by an arrow 37 to move the second bonding surface 12a to a position capable of bonding (S231 in FIG. 6). In this manner, a free space without any obstacle can be formed when loop control of the wire is performed. Note that the rotation timing indicated by (1) in FIG. 7 is a comparative example. In this comparative example, the rotational operation is performed after the capillary 22 is moved to the highest position (apex), and hence the wire is excessively fed from the capillary, with the result that the loop shape of the resultant bonding wire is more bulging (see (1) in FIG. 8).

Even at the rotation timing indicated by (4) in FIG. 7, if the bonding stage is rotated in the X and Y directions before the capillary is moved, the capillary does not contact the product depending on the shape of the product, such as when the first bonding point is located on a tall chip.

Next, the capillary 22 is lowered toward a second bonding point, and the capillary 22 is moved to the second bonding surface 12a of the second electrode 12 (S26 in FIG. 6). The other end of the wire 21 is bonded to the second bonding surface 12a of the second electrode 12 (S27 in FIG. 6).

Note that the operations at the steps indicated by Steps S21 to S27 and S231 illustrated in FIG. 6 are controlled by the control unit 38.

According to the present embodiment, the capillary 22 can be prevented from contacting an obstacle during loop control, and hence the operation to avoid an obstacle is unnecessary, and excessive wire feeding can be suppressed. As a result, a low loop with small sag can be formed.

In the present embodiment, the bonding stage 34 is rotated at any timing between Step S22 and Step S25 illustrated in FIG. 6, and hence the rotation of the bonding stage 34 can be used as a pre-forming operation for loop formation of the bonding wire. By using the rotational operation of the bonding stage 34 to apply a bending habit to the bonding wire in this manner, a loop having a more complicated shape can be formed.

Figure 8:
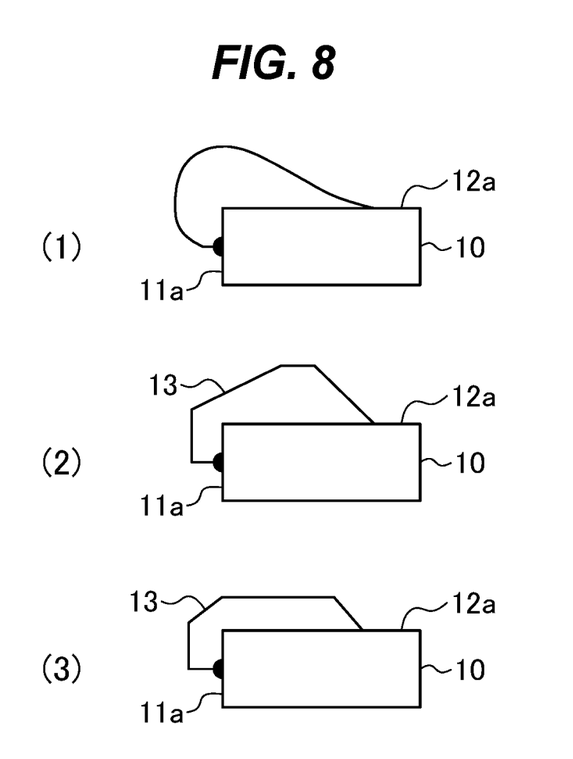
FIG. 8 is a view for describing a relation between a timing to rotate a bonding stage 34 and a loop shape of a bonding wire 13.

FIG. 8 is a view for describing a relation between a timing to rotate the bonding stage 34 and a loop shape of the bonding wire 13.

When the rotational operation is performed at the timing (1) illustrated in FIG. 7, the loop shape as indicated by (1) in FIG. 8 is formed. When the rotational operation is performed at the timing (2) illustrated in FIG. 7, the loop shape as indicated by (2) in FIG. 8 is formed. When the rotational operation is performed at the timing (3) illustrated in FIG. 7, the loop shape as indicated by (3) in FIG. 8 is formed.

Note that, in the present embodiment, the case where the angle between by the first bonding surface and the second bonding surface is 270° has been described, but even when the angle is 200° or more (preferably 220° or more, more preferably 240° or more, still more preferably 255° or more), a desired loop shape can be formed.

As described above, the operation to control the capillary 22 to avoid an obstacle is unnecessary, and any complicated loop shape can be formed. Thus, the following effects are obtained.

Low loop of product
Downsizing of product
Stable product performance
Cost reduction of product
Reduction in consumption amount of gold wire
Reduction in circuit
Shortening of production time (increase in production tact)
Prevention of damage to apparatus and product
Shortening of product development time

EXPLANATION OF SYMBOLS

10 PRODUCT (WORKPIECE)
11 FIRST ELECTRODE
11a FIRST BONDING SURFACE
12 SECOND ELECTRODE
12a SECOND BONDING SURFACE
13 BONDING WIRE
14 ANGLE FORMED BY FIRST BONDING SURFACE AND SECOND BONDING SURFACE
21 WIRE
22 CAPILLARY
23 ROTATION CENTER
24 ARROW
25 FREE SPACE
31 X MOVEMENT MECHANISM
32 Y MOVEMENT MECHANISM
33 Z MOVEMENT MECHANISM
34 BONDING STAGE
35 ROTATION MECHANISM
36 ROTATION CENTER
37 ARROW
41 ULTRASONIC HORN
51, 52, 53, 54, 55 MOVEMENT LOCUS
101 FIRST ELECTRODE
101a FIRST BONDING SURFACE
102 second ELECTRODE
102a second BONDING SURFACE
103, 104 BONDING WIRE
105 WIRING

The invention claimed is:

1. A wire bonding method for bonding a first end of a wire to a first bonding surface and bonding a second end of the wire to a second bonding surface, comprising:
bonding the first end of the wire fed from a distal end of a capillary to the first bonding surface;
moving the capillary in a Z direction while feeding the wire from the distal end of the capillary;
moving the capillary in a direction including at least one of an X direction and a Y direction while feeding the wire from the distal end of the capillary;
moving the capillary in a direction including at least one of the X direction, the Y direction, and the Z direction a plurality of times while feeding the wire from the distal end of the capillary;
moving the capillary to a highest position; and
moving the capillary to the second bonding surface and bonding the second end of the wire to the second bonding surface, wherein
the wire bonding method includes, at any timing between the moving of the capillary in the Z direction and the moving of the capillary in the direction including the at least one of the X direction, the Y direction, and the Z direction, rotating the first bonding surface about a rotation axis to move the second bonding surface to a position capable of bonding, the moving of the capillary to the highest position is performed after the rotating of the first bonding surface, and an angle formed by the first bonding surface and the second bonding surface on a side where the wire is stretched is 200° or more.

2. The wire bonding method according to claim 1, wherein the angle is 240° or more.

3. The wire bonding method according to claim 1, wherein the any timing is any one of
   a timing immediately after the moving of the capillary in the Z direction,
   a timing in a middle of the moving of the capillary in the direction including the at least one of the X direction and the Y direction,
   a timing immediately after the moving of the capillary in the direction including the at least one of the X direction and the Y direction, and
   a timing in a middle of the moving of the capillary in the direction including the at least one of the X direction, the Y direction, and the Z direction.

4. A wire bonding apparatus for bonding a first end of a wire to a first bonding surface and bonding a second end of the wire to a second bonding surface, comprising:
   a capillary having a through hole through which the wire is inserted;
   an X movement mechanism for moving the capillary relative in an X direction to the first bonding surface or the second bonding surface;
   a Y movement mechanism for moving the capillary relative in a Y direction to the first bonding surface or the second bonding surface;
   a Z movement mechanism for moving the capillary relative in a Z direction to the first bonding surface or the second bonding surface;
   a stage for holding a workpiece having the first bonding surface and the second bonding surface;
   a rotation mechanism for rotating the stage; and
   a control unit for controlling the capillary, the X movement mechanism, the Y movement mechanism, the Z movement mechanism, and the rotation mechanism, wherein
   the control unit controls the capillary, the X movement mechanism, the Y movement mechanism, the Z movement mechanism, and the rotation mechanism to perform the following operations:
      bonding the first end of the wire fed from a distal end of the capillary to the first bonding surface;
      moving the capillary in the Z direction while feeding the wire from the distal end of the capillary;
      moving the capillary in a direction including at least one of the X direction and the Y direction while feeding the wire from the distal end of the capillary;
      moving the capillary in a direction including at least one of the X direction, the Y direction, and the Z direction a plurality of times while feeding the wire from the distal end of the capillary;
      moving the capillary to a highest position;
      moving the capillary to the second bonding surface to bond the second end of the wire to the second bonding surface; and
      rotating the stage by the rotation mechanism, at any timing between the moving of the capillary in the Z direction and the moving of the capillary in the direction including the at least one of the X direction, the Y direction, and the Z direction, to move the second bonding surface to a position capable of bonding,
   an angle formed by the first bonding surface and the second bonding surface on a side where the wire is stretched is 200° or more, and
   the control unit controls the capillary, the X movement mechanism, the Y movement mechanism, the Z movement mechanism, and the rotation mechanism to perform the moving of the capillary to the highest position after the rotating of the stage.

* * * * *